United States Patent
Keelan

(10) Patent No.: US 9,224,782 B2
(45) Date of Patent: Dec. 29, 2015

(54) IMAGING SYSTEMS WITH REFERENCE PIXELS FOR IMAGE FLARE MITIGATION

(71) Applicant: Semiconductor Components Industries, LLC, Phoenix, AZ (US)

(72) Inventor: Brian Keelan, Boulder Creek, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 252 days.

(21) Appl. No.: 13/971,712

(22) Filed: Aug. 20, 2013

(65) Prior Publication Data

US 2014/0313350 A1 Oct. 23, 2014

Related U.S. Application Data

(60) Provisional application No. 61/814,131, filed on Apr. 19, 2013.

(51) Int. Cl.
| | |
|---|---|
| H04N 5/357 | (2011.01) |
| H01L 27/146 | (2006.01) |
| H04N 9/04 | (2006.01) |
| H04N 5/365 | (2011.01) |
| H04N 5/367 | (2011.01) |

(52) U.S. Cl.
CPC .... *H01L 27/14685* (2013.01); *H01L 27/14621* (2013.01); *H01L 27/14623* (2013.01); *H04N 5/3572* (2013.01); *H04N 5/3651* (2013.01); *H04N 9/045* (2013.01); *H04N 5/367* (2013.01)

(58) Field of Classification Search
None
See application file for complete search history.

(56) References Cited

U.S. PATENT DOCUMENTS

| | | | |
|---|---|---|---|
| 6,912,321 B2 | 6/2005 | Gindele | |
| 6,975,775 B2 | 12/2005 | Rykowski et al. | |
| 8,411,174 B2 | 4/2013 | Ovsiannikov | |
| 8,482,639 B2 | 7/2013 | Tai et al. | |
| 2006/0017829 A1* | 1/2006 | Gallagher | 348/276 |
| 2011/0069210 A1* | 3/2011 | Ogura et al. | 348/247 |

OTHER PUBLICATIONS

Mlinar et al., U.S. Appl. No. 13/736,768, filed Jan. 8, 2013.
Stern et al., U.S. Appl. No. 13/942,201, filed Jul. 15, 2013.

\* cited by examiner

*Primary Examiner* — Twyler Haskins
*Assistant Examiner* — Angel L Garces-Rivera
(74) *Attorney, Agent, or Firm* — Treyz Law Group, P.C.; Michael H. Lyons

(57) ABSTRACT

Imaging devices may include processing circuitry, a lens, and an array of image sensor pixels and reference pixels. The array may receive direct image light and stray light from the lens. The image sensor pixels may include clear color filter elements and the reference pixels may include opaque color filter elements. The opaque color filter elements may block direct image light from being captured by the reference pixels. The image sensor pixels may generate pixel values in response to the direct image light and the stray light whereas the reference pixels may generate reference pixel values in response to the stray light. The processing circuitry may mitigate stray light effects such as local flare and veiling glare within the imaging system by adjusting the pixel values based on the reference pixel values. The imaging system may be calibrated in a calibration system for generating stray light calibration data.

19 Claims, 9 Drawing Sheets

.US 9,224,782 B2

IMAGING SYSTEMS WITH REFERENCE PIXELS FOR IMAGE FLARE MITIGATION

This application claims the benefit of provisional patent application No. 61/814,131, filed Apr. 19, 2013, which is hereby incorporated by reference herein in its entirety.

BACKGROUND

This relates generally to imaging devices, and more particularly, to imaging devices with clear image pixels.

Image sensors are commonly used in electronic devices such as cellular telephones, cameras, and computers to capture images. In a typical arrangement, an electronic device is provided with an array of image pixels arranged in pixel rows and pixel columns. Circuitry is commonly coupled to each pixel column for reading out image signals from the image pixels.

Light from objects in the field-of-view of an imaging system is typically focused onto the array of image pixels during image capture operations. In some situations, light from a light source that is inside or outside the field-of-view can enter the imaging system at a large angle of incidence or may travel along another path that results in multiple reflections within the optical system. This type of unwanted light can be reflected from one or more surfaces at which there are changes in refractive index in the imaging system before being absorbed by image pixels in the array, thereby generating flare artifacts in captured images.

It would therefore be desirable to be able to provide imaging devices with improved means of capturing and processing image signals.

DETAILED DESCRIPTION

Electronic devices such as digital cameras, computers, cellular telephones, and other electronic devices include image sensors that gather incoming light to capture an image. The image sensors may include arrays of image sensor pixels. The pixels in an image sensor may include photosensitive elements such as photodiodes that convert the incoming light into digital pixel data. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
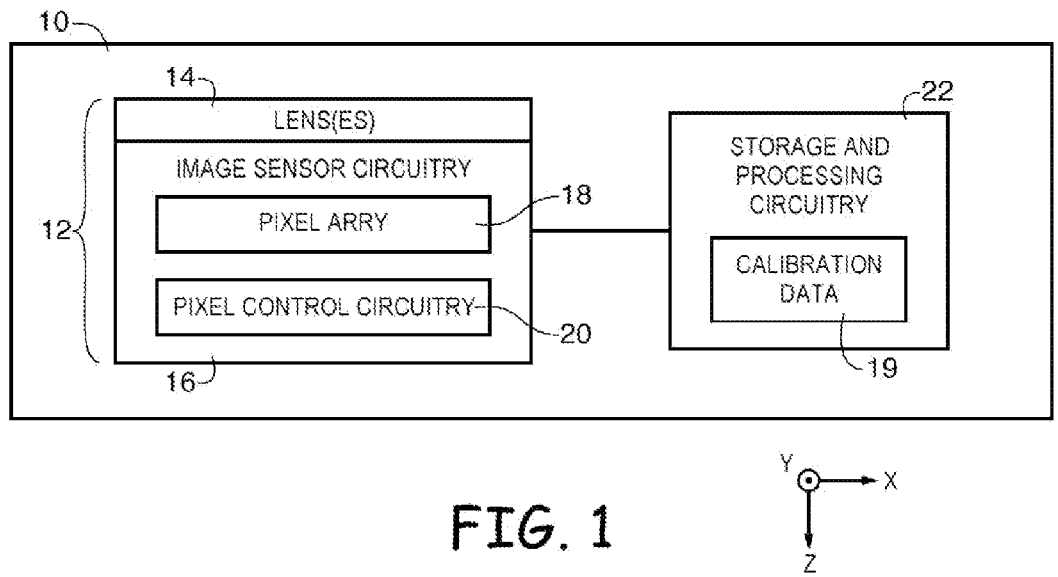
FIG. 1 is a diagram of an illustrative electronic device having an imaging system with an image sensor and processing circuitry in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into electric charges and eventually into digital image data. Camera module 12 may include one or more lenses 14 and image sensor circuitry 16 (e.g., one or more image sensors 16). Image sensor 16 may include arrays of image sensor pixels arranged in rows and columns such as a pixel array 18. Image sensor pixels in pixel array 18 may, for example, be formed on a planar surface (e.g., parallel to the x-y plane of FIG. 1) of a semiconductor substrate such as a silicon die. Image pixels in pixel array 18 may be controlled using pixel control circuitry 20. During image capture operations, light from a scene may be focused onto pixel array 18 by lens 14. Image sensor 16 may include any number of pixel arrays 18 (e.g., one pixel array, two pixel arrays, ten pixel arrays, etc.).

Image sensor pixels in pixel array 18 may generate pixel data (e.g., a respective pixel value generated by each image sensor pixel) in response to receiving light from a scene. For example, image sensor pixels in array 18 may include photosensitive elements such as photodiodes that convert incoming light into electric charge. Pixel control circuitry 20 may convert the electric charge into digital pixel data.

Image sensor 16 may receive control signals from storage and processing circuitry 22 and may supply pixel data to storage and processing circuitry 22. Storage and processing circuitry 22 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensor 16).

If desired, calibration data 19 may be stored on storage and processing circuitry 22. Calibration data 19 may, for example, include instructions for performing image processing operations on pixel data received from image sensor 16, instructions for supplying control signals to image sensor 16, or any other desired calibration information for performing image capture and processing operations using device 10. Calibration data 19 may be generated and stored on storage and processing circuitry 22 prior to normal operations of device 10 (e.g., calibration data 19 may be generating during manufacture of image sensor 16, during factory calibration of image sensor 16, during assembly of device 10, etc.).

Pixel array 18 may include a number of image sensor pixels arranged in rows and columns. Image sensor pixels in pixel array 18 may be provided with a color filter array having multiple color filter elements which allows a single image sensor to sample light of different colors. Image sensor pixels such as the image pixels in pixel array 18 are conventionally provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. However, limitations of signal to noise ratio (SNR) that are associated with the Bayer Mosaic pattern make it difficult to reduce the size of image sensors such as image sensor 16. It may therefore be desirable to be able to provide image sensors with an improved means of capturing images.

Figure 2:
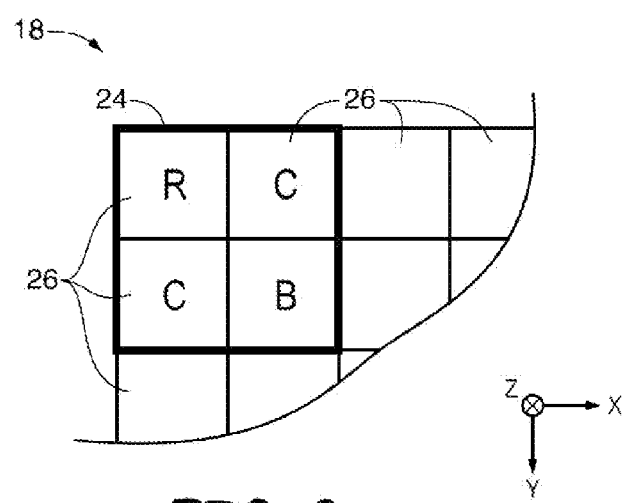
FIG. 2 is a diagram of an illustrative pixel unit cell in an image sensor pixel array having clear filter pixels in accordance with an embodiment of the present invention.

In one suitable example that is sometimes discussed herein as an example, the green pixels in a Bayer pattern are replaced by clear image pixels as shown in FIG. 2. As shown in FIG. 2, pixel array 18 may have multiple image pixels 26 formed on a planar surface (e.g., parallel to the x-y plane of FIG. 2). A repeating two-pixel by two-pixel unit cell 24 of image pixels 26 may be formed from two clear image pixels (C) (sometimes referred to herein as white image pixels) that are diagonally opposite one another and adjacent to a red (R) image pixel that is diagonally opposite to a blue (B) image pixel. Clear image pixels 26 in unit cell 24 may be formed with a visibly transparent color filter that transmits light across the visible light spectrum (e.g., clear pixels 26 can capture white light). Clear image pixels 26 may have a natural sensitivity defined by the material that forms the transparent color filter and/or the material that forms the image sensor pixel (e.g., silicon). The sensitivity of clear image pixels 26 may, if desired, be adjusted for better color reproduction and/or noise characteristics through use of light absorbers such as pigments. Pixel array 18 having clear image pixels 26 may sometimes be referred to herein as clear filter pixel array 18.

Unit cell 24 may be repeated across clear filter pixel array 18 to form a mosaic of red, clear, and blue image pixels 26. In this way, red image pixels may generate red image signals in response to red light, blue image pixels may generate blue image signals in response to blue light, and clear image pixels may generate clear image signals in response to white light. The clear signals may also be generated by the clear image pixels in response to any suitable combination of red, blue, and/or green light. For example, the red image signals may have a first spectral response value (e.g., an integrated signal power level as a function of the frequency of light received by red image sensor pixels), the blue image signals may have a second spectral response value, and the clear image signals may have a third spectral response value that is, for example, greater than seventy five percent of a sum of the first and second spectral response values (e.g., clear image signals may have a broad sensitivity for light received from an equal energy radiator over the visible light spectrum with standard CIE illuminant E).

The unit cell 24 of FIG. 2 is merely illustrative. If desired, any color image pixels may be formed adjacent to the diagonally opposing clear image pixels in unit cell 24 (e.g., the red image pixels in unit cell 24 may be replaced with blue image pixels, the blue image pixels in unit cell 24 may be replaced with red image pixels, the red image pixels in unit cell 24 may be replaced with yellow image pixels, etc.).

Clear image pixels 26 can help increase the signal-to-noise ratio (SNR) of image signals captured by image sensor 16 by gathering additional light in comparison with image pixels having a narrower color filter (e.g., a filter that transmits light over a subset of the visible light spectrum), such as green image pixels. Clear image pixels 26 may particularly improve SNR in low light conditions in which the SNR can sometimes limit the image quality of images. Image signals generated by clear filter pixel array 18 may be converted to red, green, and blue image signals to be compatible with circuitry and software that is used to drive most image displays (e.g., display screens, monitors, etc.). This conversion generally involves the modification of captured image signals using a color correction matrix (CCM).

Figure 3:
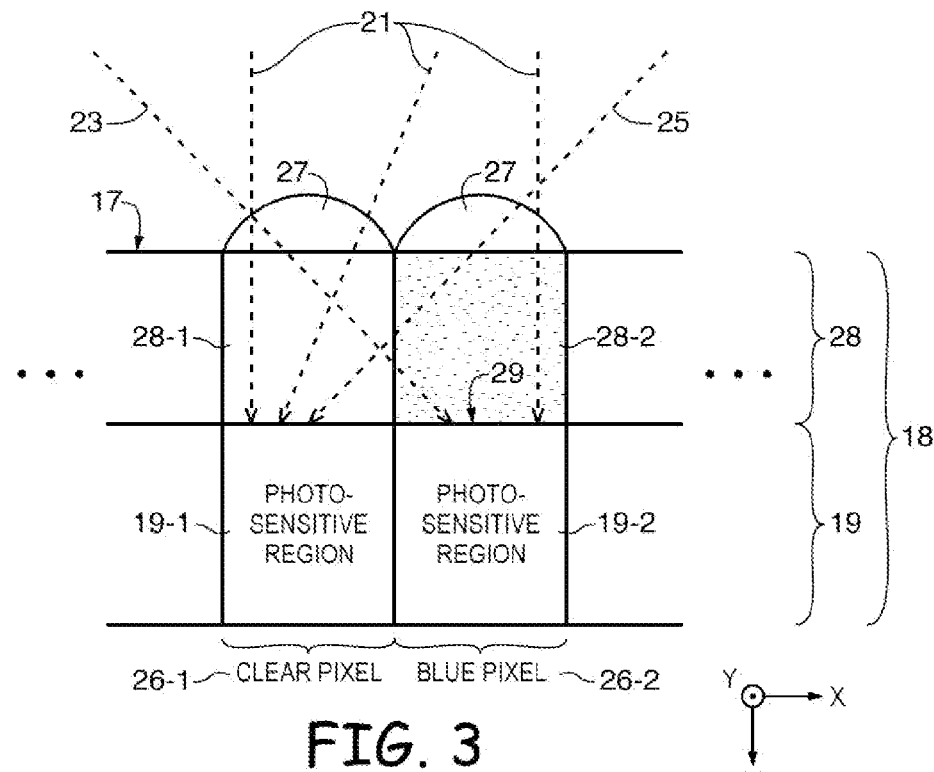
FIG. 3 is a cross-sectional diagram of an illustrative pixel array having clear filter pixels in accordance with an embodiment of the present invention.

In pixel arrays having clear image pixels such as clear filter pixel array 18, stray light (sometimes referred to herein as high incident angle light) may propagate through image pixels 26 with minimal attenuation, often producing extraneous image signal in colored image pixels located adjacent to clear image pixels 26. FIG. 3 is an illustrative cross-sectional diagram of clear filter pixel array 18 that shows how stray light may propagate through image pixels 26 in clear filter pixel array 18.

As shown in FIG. 3, pixel array 18 may include a clear image pixel 26-1 and a blue image pixel 26-2 (e.g., clear image pixel 26-1 and blue image pixel 26-2 arranged in a unit cell such as unit cell 24 of FIG. 2). Each image pixel in pixel array 18 may include a corresponding color filter element 28 and photo-sensitive region 19 (e.g., clear image pixel 26-1 may include a clear color filter element 28-1 formed on an upper surface 29 of a first photo-sensitive region 19-1, blue image pixel 26-2 may include a blue color filter element 28-2 formed on an upper surface 29 of a second photo-sensitive region 19-2, etc.). If desired, each image pixel 26 may include a respective microlens 27 formed on an upper surface 17 of the corresponding color filter element 28.

During imaging operations, stray light (sometimes referred to herein as high incident angle light) and direct image light (sometimes referred to herein as proper imaging light or true imaging light) may be incident upon pixel array 18. Direct image light may pass through upper surface 17 of the color filter 28 associated with a given pixel 26 prior to being received by the photosensitive region 19 associated with that image pixel. Stray light may be received by the photosensitive region 19 of a given image pixel 26 through adjacent image pixels 26 (e.g., stray light may pass through the color filter elements of other image pixels prior to being captured by the photosensitive region of a particular image pixel).

As shown in FIG. 3, clear pixel 26-1 may receive direct image light 21 through upper surface 17 of clear color filter element 28-1 and blue pixel 26-2 may receive direct image light 21 through upper surface 17 of blue color filter 28-2. Blue pixel 26-2 may receive stray light 23 through portions of clear pixel 26-1 (e.g., through microlens 27 and/or clear color filter element 28-1 associated with clear pixel 26-1). Clear pixel 26-1 may receive stray light 25 through portions of blue pixel 26-2. In some situations, stray light such as stray light 23 and 25 originates outside the field-of-view of camera module 12 and is transmitted along a path through some or all of lenses 14 and onto image sensor 16 (FIG. 1). In other situations, light that originates within the field-of-view of camera module 12 can also generate stray light 23 and 25 (e.g., light may encounter one or more changes in refractive index within camera module 12 such as interfaces between air and plastic or glass that cause some light to be reflected back from the interface and eventually onto the image sensor via multiple reflection paths).

Color filter elements 28 may attenuate direct light 21 and stray light 23 and 25. For example, darker color filter elements may attenuate image light more than lighter color image lights. Clear color filter elements such as clear color filter element 28-1 may attenuate all colors of light less than colored color filter elements (e.g., green color filter elements, blue color filter elements such as blue color filter element 28-2, etc.). Because light can pass through clear color filter 28-1 without being attenuated, more stray light is received at photosensitive region 19-2 of blue pixel 26-2 than would be received by blue pixel 26-2 if clear color filter element 28-1 were to be replaced with a colored color filter element (e.g., in scenarios where clear color filter element 28-1 is replaced with a colored color filter element such as a green color filter element, stray light 23 would be substantially attenuated by both filter elements 28-1 and 28-2 prior to being received by blue pixel photosensitive region 26-2). In this scenario, blue pixel 26-2 may generate an erroneously high pixel value because stray 23 passes through clear filter element 28-1 and is un-attenuated prior to being passed through blue color filter element 28-2 and received photosensitive region 26-2 (e.g., blue pixel 26-2 may generate a greater pixel value when clear color filter element 28-1 is used than if clear color filter element 28-1 were to be replaced with a colored color filter element because clear color filter element 28-1 attenuates high stray light 23 less than a colored color filter element).

Stray light such as stray light 23 and 25 received by pixel array 18 may cause colored image pixels that are formed adjacent to clear image pixels 26 to generate erroneously high pixel values (e.g., erroneously high blue pixel values may be generated by blue image pixels adjacent to clear image pixels 26, erroneously high red pixel values may be generated by red image pixels adjacent to clear image pixels 26, etc.). In some situations in which a given colored image pixel should generate a black pixel value (e.g., because no light from the scene is incident upon that image pixel), stray light that passes through a clear image pixel adjacent to the given colored image pixel may cause that colored image pixel to record a positive pixel value even though no direct image light from the scene was incident upon upper surface 17 of that colored image pixel.

Stray light present in clear filter pixel array 18 may include localized stray light (e.g., stray light that affects only a subset of the pixels in array 18) and global stray light (e.g., stray light that affects all pixels in array 18). Global stray light that is approximately uniform across the entire pixel array 18 may sometimes be referred to herein as veiling glare. Local stray light that only affects a subset of the pixels in array 18 may sometimes be referred to as local flare. Veiling glare may be present for all image pixels 26 in clear filter pixel array 18 during normal imaging operations, whereas local flare may be produced when bright objects such as the sun or other bright lights illuminate only a portion of array 18 or are slightly outside the field of view of array 18. Local flare can sometimes produce undesirable "ghost images" that are often colored. If care is not taken, un-attenuated stray light that is passed through clear image pixels 26 onto colored image pixels 26 (e.g., high-incident angle stray light 23 of FIG. 3) can cause image sensor 16 to generate colored pixel signals for areas of the imaged scene that should be black, to incorrectly calculate image signals for other colors, and/or to produce localized color artifacts. It may therefore be desirable to be able to provide clear pixel imaging systems with improved methods for compensating for stray light captured by clear filter pixel array 18.

In one suitable arrangement for compensating for stray light captured by image sensor 16, clear filter pixel array 18 may include one or more so-called "reference pixels" distributed throughout the array. Reference pixels in clear filter pixel array 18 may be image pixels 26 that block direct image light 21 that is incident upon upper surface 17 of the associated pixel. In this way, reference pixels in clear filter pixel array 18 may generate pixel values in response to receiving stray light from adjacent image pixels and/or electronic crosstalk between the reference pixels and other image pixels in array 18 (e.g., reference pixels in array 18 may generate pixel values in response to stray light while filtering out direct image light). Pixel values generated by reference pixels in array 18 may be used by processing circuitry 18 to estimate a true black level of the imaged scene (e.g., local black levels of portions of the imaged scene) and to compensate for stray light in the imaging system (e.g., to mitigate local and global flare effects in captured image data).

This example is merely illustrative. In general, reference pixels in clear filter pixel array 18 may be formed as image pixels that filter out light received from any desired image light source. For example, reference pixels in clear filter pixel array 18 may be image pixels that filter out direct imaging light 23 (e.g., light incident upon upper surface 17 of the associated pixel), may be image pixels that filter out stray light received from adjacent image pixels, may be image pixels that filter out veiling glare light, may be image pixels that filter out combinations of these light sources, etc.

Figure 4:
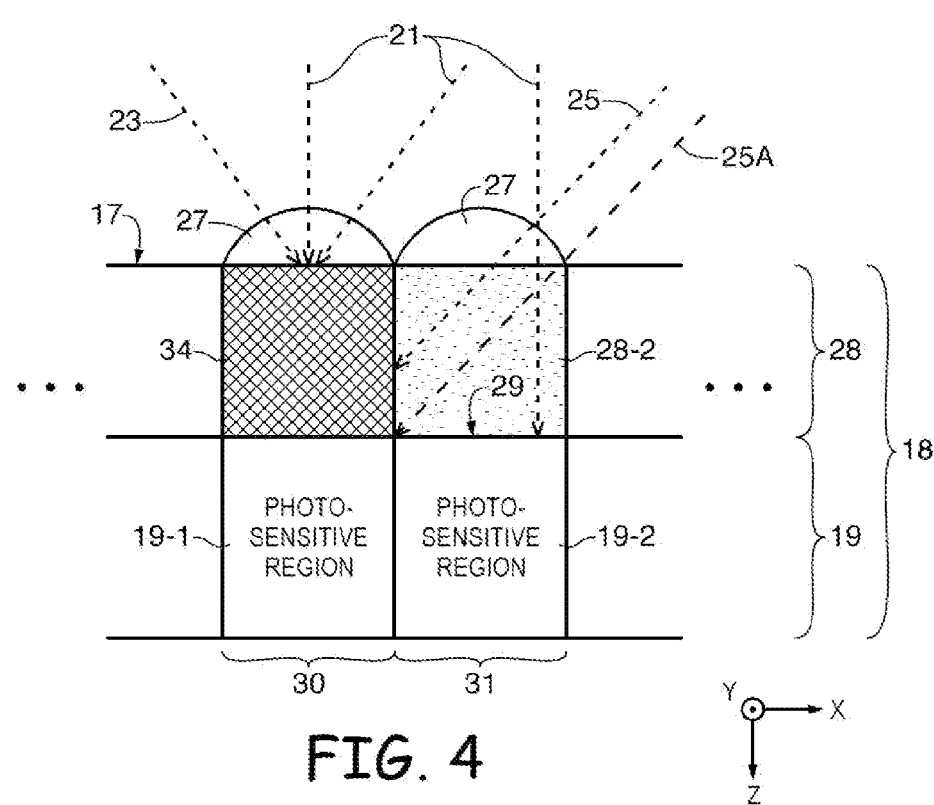
FIG. 4 is a cross-sectional diagram of an illustrative pixel array having a reference pixel with a black (opaque) color filter element for blocking direct image light in accordance with an embodiment of the present invention.

FIG. 4 is an illustrative cross-sectional diagram of clear filter pixel array 18 having a reference pixel formed adjacent to a colored image sensor pixel. As shown in FIG. 4, reference pixel 30 may be formed adjacent to colored image sensor pixel 31. Reference pixel 30 may have a substantially opaque color filter element 34 formed on upper surface 29 of photosensitive region 19-1. Reference pixel 30 may, for example, be a clear image pixel such as clear image pixel 26-1 of FIG. 3 having opaque color filter element 34 in place of clear filter element 28-1. Opaque color filter element 34 may be, for example, a black color filter element that substantially absorbs light received across the visible spectrum. If desired, opaque color filter element 34 may include a mixture of color filter array pigments (e.g., a mix of red and blue color filter array pigments). Direct image light 21 and stray light 23 incident upon upper surface 17 of reference pixel 30 may be blocked by opaque filter element 34 (e.g., opaque filter element 34 may substantially attenuate/filter direct image light 21 and stray light 23 across the visible spectrum).

Colored image pixel 31 may be formed adjacent to reference pixel 30 in clear filter pixel array 18. For example, blue image pixel 26-2 (FIG. 3) may be used as adjacent image pixel 31. As shown in FIG. 4, stray light 25 incident upon adjacent image pixel 31 may pass through blue color filter element 28-2 and may be blocked by opaque color filter element 34 in reference pixel 30. As shown by FIG. 4, a portion of the stray light incident upon array 18, such as stray light 25A incident upon adjacent image pixel 31, may pass through blue color filter element 28-2 and may propagate to photosensitive region 19-1 of reference pixel 30 (e.g., stray light 25A may be propagate under opaque color filter element 34). In this example, pixel values generated by reference pixel 30 may be a measure of the stray light incident on array 18 (e.g., a subset of the stray light incident on array 18 such as stray light 25A) and electronic crosstalk (e.g., between reference pixel 30 and adjacent pixels in array 18) that would have been recorded by a clear pixel formed at the location of reference pixel 30, providing information that may be used by processing circuitry 22 for correcting for stray light and electronic crosstalk in array 18. FIG. 4 is merely illustrative. If desired, adjacent image pixel 31 may be formed with any desired color filter element 28 (e.g., a red color filter element, a yellow color filter element, a green color filter element, etc.).

Figure 5:
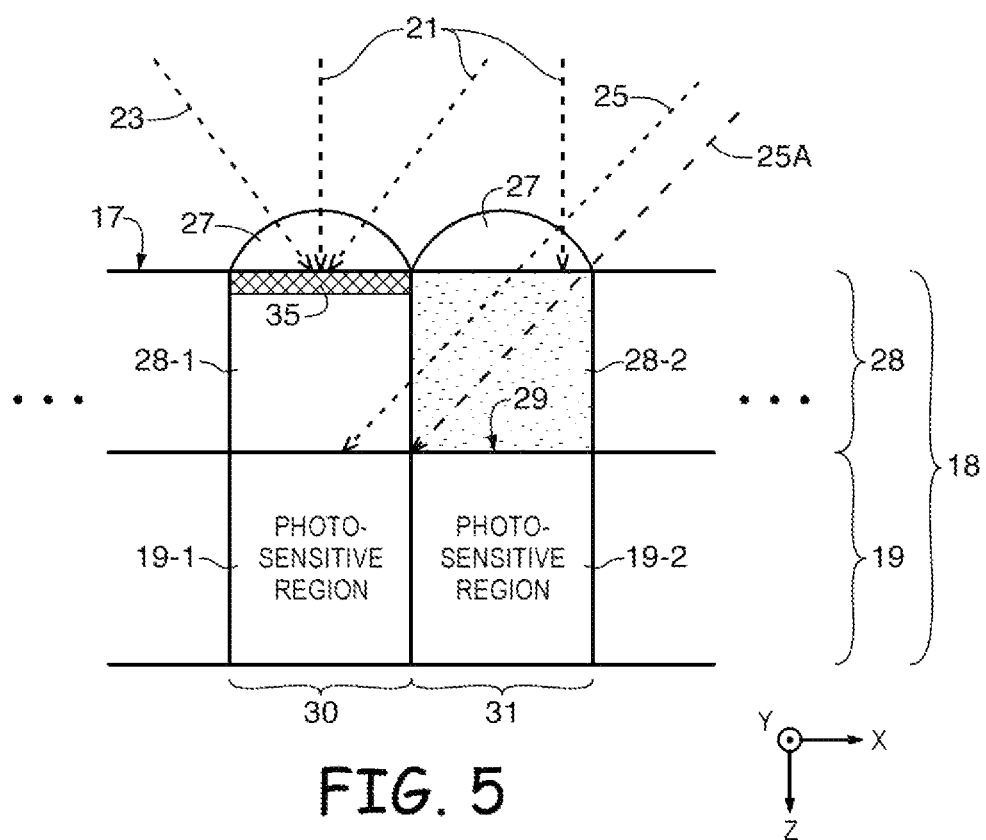
FIG. 5 is a cross-sectional diagram of an illustrative pixel array having a reference pixel with an opaque metal surface layer for blocking direct image light in accordance with an embodiment of the present invention.

If desired, reference pixels 30 may be provided with a metal shield layer formed on upper surface 17 of clear filter element 28-1, as shown in FIG. 5. As shown in FIG. 5, reference pixel 30 may be formed with a metal shield layer 35 formed at upper surface 17 of clear filter element 28-1 (e.g., metal layer 35 may be interposed between clear filter element 28-1 and microlens 27). Metal shield layer 35 may, for example, be formed during the CMOS manufacturing process for pixel array 18. Metal shield layer 35 may block direct image light 21 and stray light 23 incident upon surface 17 of reference pixel 30. In this example, stray light 25 from adjacent pixel 31 may be captured by photo-sensitive region 19-1 of reference pixel 30. The examples of FIGS. 4 and 5 are merely illustrative. If desired, reference pixels 30 may be formed with any desired structure for blocking direct image light at upper surface 17 (e.g., reference pixels 30 may be formed with any desired structure for blocking direct image light 21 from being captured by photosensitive region 19-1 of reference pixel 30). The example of FIG. 5 is merely illustrative. If desired, metal shield layer 35 may be formed on upper surface 29 of photo-sensitive region 19-1 (e.g., shield layer 35 may be interposed between filter element 28-1 and region 19-1) or at any other desired location in reference pixel 30.

Pixel values generated by photosensitive regions 19 of image pixels 26 may include multiple pixel value components that are each generated in response to light received by photosensitive region 19 from a particular image source. For example, pixel values generated by adjacent pixel 31 may include a proper imaging light component, a stray light component, a veiling glare component, etc. Because stray light 23 is blocked from passing to adjacent image pixel 31 by reference pixels 30, photosensitive region 19-2 of adjacent image pixels 31 may receive less stray light than other image pixels 26 in clear filter pixel array 18 that are not formed adjacent to a reference pixel 30. Adjacent image pixels 31 may generate pixel values having stray light components (e.g., pixel value components generated in response to receiving stray light from adjacent image pixels) with a reduced magnitude relative to the stray light pixel value component generated by other image pixels 26 in pixel array 18 that are not formed adjacent to reference pixels 30. Adjacent image pixels 31 may sometimes be referred to herein as perturbed image pixels 31, because the stray light component of pixel values generated by adjacent image pixels 31 is "perturbed" relative to the stray light pixel value components other image pixels 26. Image pixels 26 that are not adjacent to reference pixels 30 may sometimes be referred to herein as "unperturbed" image pixels 26.

Figure 6:
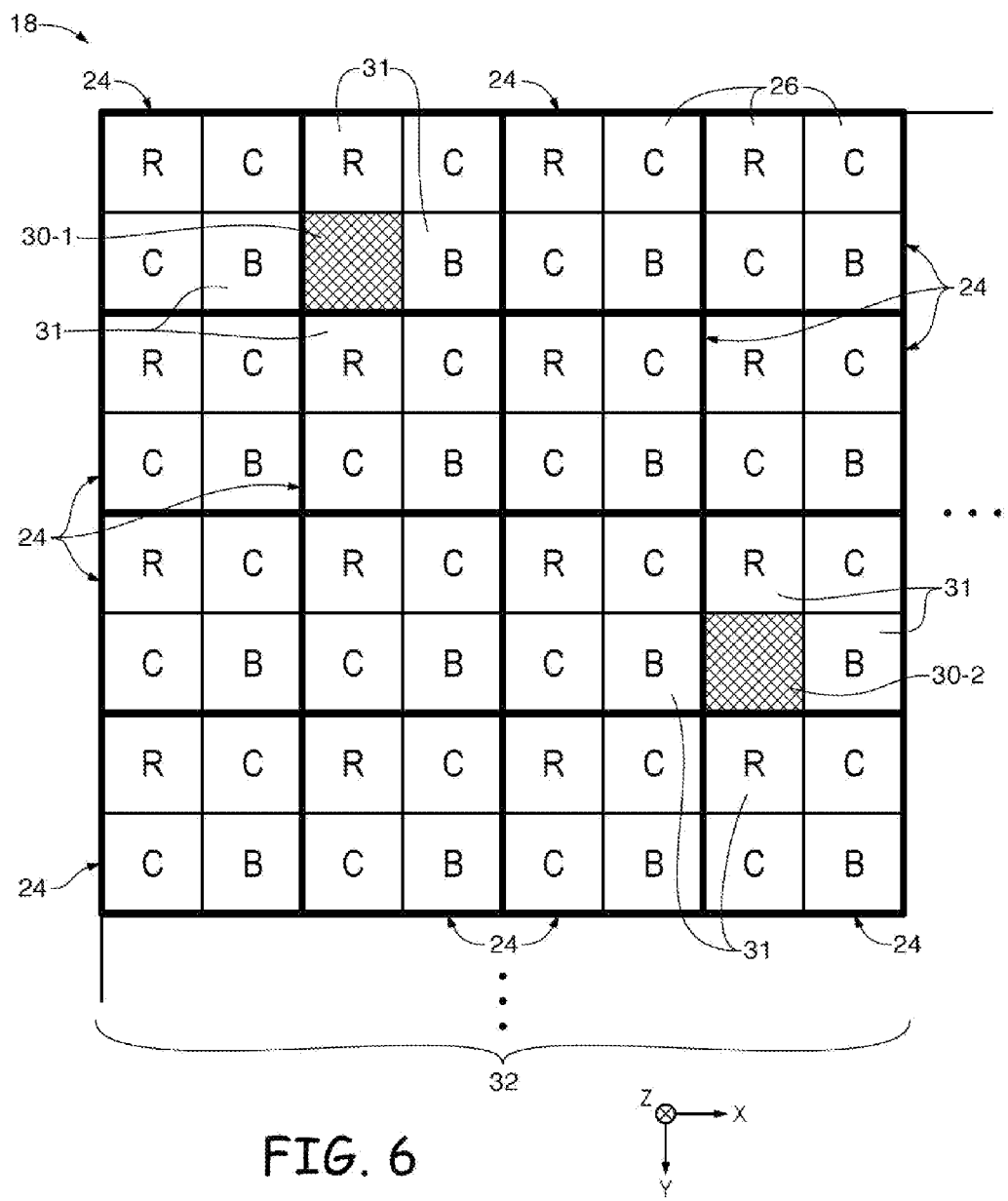
FIG. 6 is a diagram of an illustrative pixel region in an image sensor pixel array having clear filter pixels and reference pixels for compensating for stray light in accordance with an embodiment of the present invention.

Reference pixels 30 may be distributed throughout pixel array 18, as shown in FIG. 6. As shown in FIG. 6, pixel array 18 may include a number of repeating unit cell regions 32. Each unit cell region 32 includes a number of repeating clear pixel unit cells 24. Some clear pixels in pixel region 32 may be replaced with reference pixels 30 (e.g., a first reference pixel 30-1 and a second reference pixel 30-2). If desired, reference pixels 30 may be uniformly scattered throughout pixel array 18. For example, reference pixels 30 may be distributed throughout pixel region 32 at a uniform reference pixel density and with known reference pixel locations (e.g., processing circuitry 22 of FIG. 1 may store address locations of reference pixels 30). Four perturbed pixels 31 may be located adjacent to each reference pixel 30.

In the example of FIG. 6, one reference pixel 30 is formed for every eight unit cells 24 (e.g., two reference pixels 30 are formed for every pixel region 32). However, this is merely illustrative. If desired, any number of image pixels 26 in array 18 may be replaced with reference pixels 18 (e.g., seven percent of image pixels 26 in array 18 may be replaced with reference pixels 30, less than seven percent of image pixels 26 in array 18 may be replaced with reference pixels 30, three percent of image pixels 26 in array 18 may be replaced with reference pixels 30, less than three percent of image pixels 26 in array 18 may be replaced with reference pixels 30, etc.). For example, clear filter pixel array 18 may include a first number of image sensor pixels (e.g., a total number of perturbed pixels 31 and unperturbed pixels 26 in array 18) and a second number of reference pixels 30. The second number of reference pixels 30 may be less than or equal to three percent of the first number of image sensor pixels in array 18. In general, a greater number of reference pixels 30 provides image sensor 16 with a better spatial sampling of stray light throughout pixel array 18 than a smaller number of reference pixels 30, whereas a smaller number of reference pixels 30 may allow pixel array 18 to capture more image light than a greater number of reference pixels 30.

In another suitable arrangement, a greater number of reference pixels may be formed along the periphery of pixel array 18 than in the middle of pixel array 18. However, this is merely illustrative. If desired, reference pixels 30 may be scattered throughout pixel array 18 in any desired pattern and with any desired reference pixel density. In general, any number of colored or clear image pixels 26 may be replaced with reference pixels 30 (e.g., a subset of the blue image pixels 26 in array 18 may be replaced by reference pixels 30, a subset of the red image pixels 26 in array 18 may be replaced by reference pixels 30, a subset of clear image pixels 26 in array 18 may be replaced with reference pixels 30, etc.).

Figure 7:
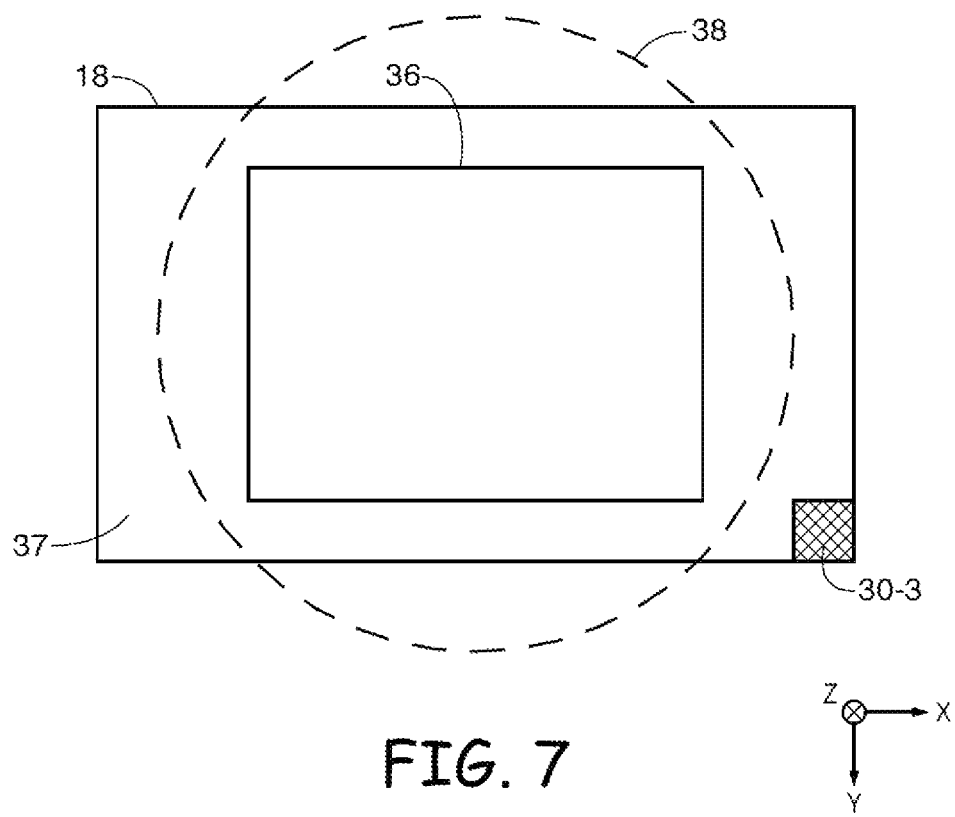
FIG. 7 is a diagram of an illustrative image sensor pixel array having an active region and an inactive region with a reference pixel for compensating for stray light in accordance with an embodiment of the present invention.

In yet another suitable arrangement, reference pixels 30 may be formed on a portion of clear filter pixel array 18 that is outside of the image circle of lens 14 (FIG. 1), as shown in FIG. 7. As shown in FIG. 7, pixel array 18 may include an active region 36 of image pixels 26 and an inactive region 37. Active region 36 may be formed under image circle 38 of lens 14 (e.g., a circle of coverage of lens 14 as shown by dashed circle 38). Stray light and direct image light transmitted by lens 14 is received by active region 36 of pixel array 18, whereas inactive region 37 of pixel array 18 does not receive direct image light from lens 14. If desired, reference pixel 30-3 may be formed in inactive region 37 (i.e., outside of image circle 38). Because no direct image light is passed from lens 14 to reference pixel 30-3 in inactive region 37, reference pixel 30-3 may generate pixel values in response to stray light. Pixel values generated by reference pixel 30-3 may be dominated by stray light noise. In this example, stray light received by reference pixel 30-3 may be correlated with stray light within the field of view 36 (e.g., using calibration data such as calibration data 19 of FIG. 1). If desired, reference pixel 30-3 may be formed without an opaque filter element 34 (FIG. 3) or metal shield layer 35 (FIG. 4), because reference pixel 30-3 is located in inactive region 37 of pixel array 18. If desired, reference pixel 30-3 may be formed from the same image pixel architecture as the image pixels in active region 36 or may be formed from different image pixel architectures than those in active region 36. For example, reference pixel 30-3 may be larger or simpler in design than the image pixels in active region 36.

Perturbed image pixels 31 and unperturbed image pixels 26 may generate pixel values in response to direct image light and stray image light (e.g., direct image light 21 and stray image light 23 and 25 of FIGS. 4 and 5). Pixel values generated by perturbed image pixels 31 and unperturbed image pixels 26 may include direct image light pixel value components (e.g., pixel value components generated in response to receiving direct image light 21 at the associated image pixel) and stray light pixel value components (e.g., pixel value components generated in response to receiving stray light 23 and/or 25 from other image pixels). In scenarios where local flare and veiling glare are present in an imaged scene, pixel values generated by pixel array 18 may include local flare pixel value components and veiling glare pixel value components. Pixel values generated by reference pixels 30, perturbed image pixels 31, and unperturbed image pixels 26 may be passed to storage and processing circuitry 22 for processing.

Storage and processing circuitry 22 may perform image processing operations on pixel values received from pixel array 18. For example, storage and processing circuitry 22 may perform stray light compensation operations to mitigate the effects of image artifacts such as color artifacts, local flare artifacts, veiling glare artifacts, etc. in the received pixel values.

Pixel values generated by reference pixels 30 may sometimes be referred to herein as reference pixel values. Reference pixel values generated by reference pixels 30 may be used by storage and processing circuitry 22 to estimate a true black level of the captured pixel values. The true black level of the captured pixel values may be representative of the pixel values generated by image pixels 26 when no light is captured. Processing circuitry 22 may use the reference pixel values to adjust the captured pixel values to compensate for stray light in image sensor 16.

Figure 8:
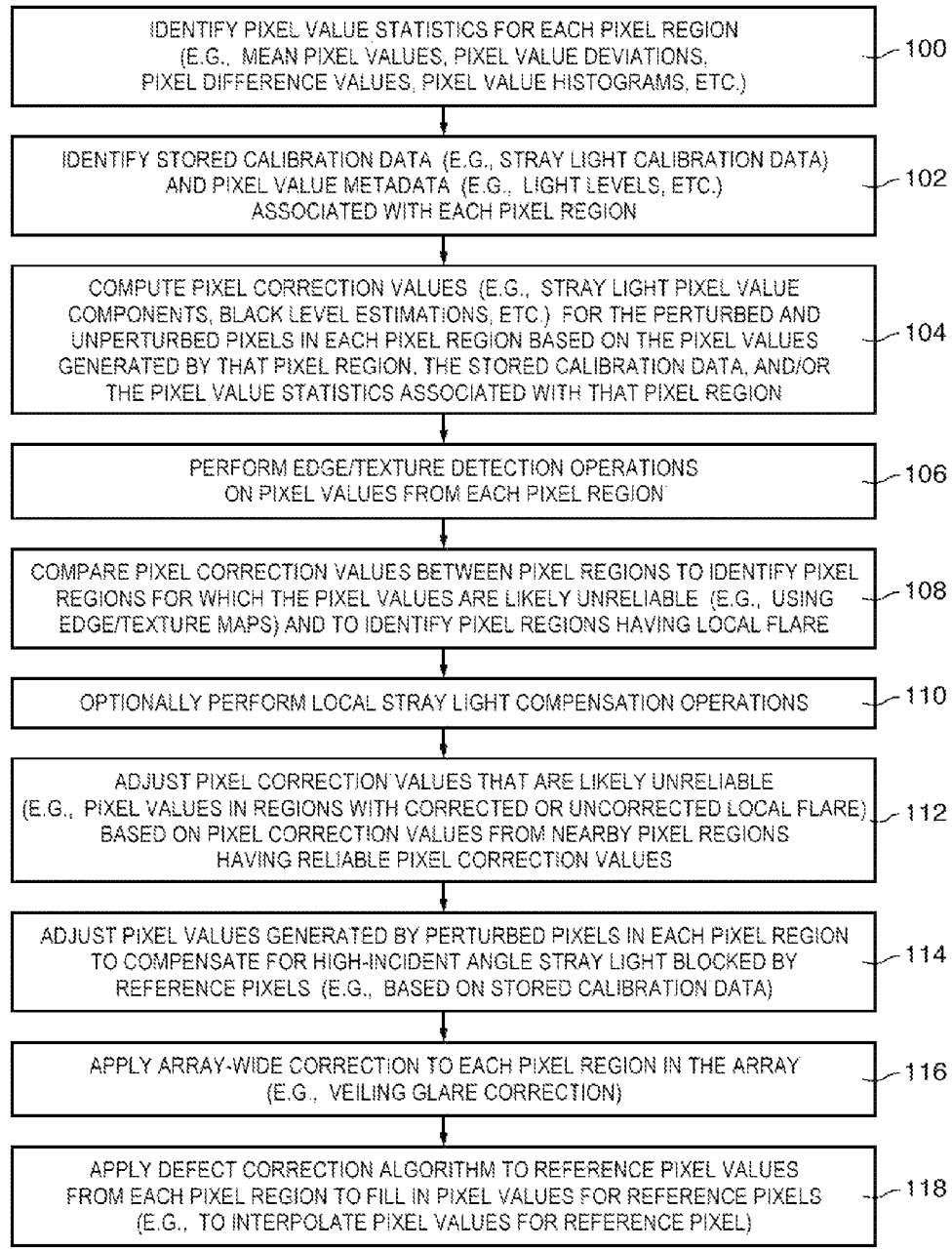
FIG. 8 is a flow chart of illustrative steps that may be performed by processing circuitry in an imaging system to compensate for stray light in an image sensor pixel array having clear filter pixels and reference pixels in accordance with an embodiment of the present invention.

FIG. 8 shows a flow chart of illustrative steps that may be performed by storage and processing circuitry 22 of FIG. 1 to perform stray light compensation operations on image data generated by clear filter pixel array 18. Reference pixels 30 may generate reference pixel values primarily in response to stray light (e.g., reference pixels 30 may generate reference pixel values while blocking substantially all of the direct image light incident upon upper surface 17 of reference pixels 30), whereas perturbed pixels 31 and unperturbed pixels 26 may generate pixel values in response to stray light and direct imaging light (e.g., pixels 26 and 30 may block no direct image light). For example, stray light components of the reference pixel values may be substantially greater than any direct image light components of the reference pixel values (e.g., reference pixel values may be dominated by stray light components whereas pixel values generated by pixels 32 and 26 may be dominated by direct image light components). Processing circuitry 22 may perform the steps of FIG. 8 after receiving pixel values from clear filter pixel array 18 for generating corrected pixel values that have been compensated for stray light in image sensor 16 (e.g., to mitigate the effects of local flare, veiling glare, etc. in the pixel values generated by clear filter pixel array 18).

At step 100, processing circuitry 22 may identify pixel values captured by pixels in each pixel region of clear filter pixel array 18 (e.g., pixel regions such as pixel region 32 of FIG. 6). For example, processing circuitry 22 may identify reference pixel values generated by reference pixels 30 (e.g., reference pixel values generated in response to direct image light 21), pixel values generated by perturbed image pixels 31, and pixel values generated by unperturbed image pixels 26 (e.g., pixel values generated in response to direct image light 21 and stray light 23 and 25) in each pixel region of array 18.

Processing circuitry 22 may identify pixel value statistics associated with the pixel values captured by each pixel region in array 18. For example, processing circuitry 22 may generate a histogram of pixel values for each pixel region and may compute mean pixel values, pixel value deviations, pixel value differences, or any other desired statistics associated with the pixel values captured by the corresponding pixel region (e.g., mean values of the pixel values captured by unperturbed image pixels 26 in each pixel region, difference values between the pixel values captured by perturbed pixels 31 and the reference pixel values in each pixel region, a mean value of pixel values captured by perturbed image pixels 31 in each pixel region, etc.). If desired, processing circuitry 22 may compare reference pixel values to pixel values captured by perturbed image pixels 31 and/or pixel values captured by unperturbed image pixels 26 for each pixel region.

At step 102, storage and processing circuitry 22 may identify stored calibration data such as stray light calibration data 19 of FIG. 1. Calibration data 19 may include, for example, mathematical models, a list of functions, coefficients, equations, or any other stray light calibration data that may be applied to captured pixel values to compensate for stray light in pixel array 18. As an example, calibration data 19 may be generated during manufacture of image sensor 16 (e.g., prior to normal operation of image sensor 16 by an end user).

If desired, storage and processing circuitry 22 may identify metadata associated with pixel values captured by each pixel region in array 18. Image sensor 16 and/or processing circuitry 22 may generate metadata for each pixel region. Metadata may include any desired metadata associated with captured pixel values, such as scene light level (e.g., a global light level for the entire pixel array 18 and/or local light levels for each pixel region), whether an excessively bright object is within a given pixel region (e.g., the sun or other bright light sources), signal-to-noise ratio, exposure times, etc.

At step 104, processing circuitry 22 may determine the level of unwanted signal in the pixel values generated by each pixel region in array 18 (e.g., unwanted signal generated in response to local and/or global stray light). Processing circuitry 22 may compute pixel correction values for perturbed pixels 31 and unperturbed pixels 26 in each pixel region based on the reference pixel values, stored calibration data 19, and/or the identified pixel value statistics for each pixel region. The pixel correction values may, for example, compensate for the unwanted signal in the captured pixel values (e.g., the pixel correction values may be offset pixel values that are indicative of the amount of unwanted signal in the captured pixel values).

If desired, processing circuitry 22 may compute pixel correction values by applying calibration data 19 to the captured pixel values and the pixel value statistics. For example, processing circuitry 22 may compute pixel correction values for perturbed pixels 31 and unperturbed pixels 26 as a linear combination of the reference pixel values, the pixel value statistics (e.g., the mean pixel value generated by unperturbed pixels 26) and the pixel values generated by perturbed pixels 31 and/or unperturbed pixels 26 (e.g., using linear weights specified by calibration data 19, using mathematical models specified by calibration data 19, etc.). As another example, processing circuitry 22 may compute the pixel correction values for perturbed pixels 31 as a sum between the reference pixel values and a given function of the pixel values generated by perturbed pixels 31 and/or unperturbed pixels 26 (e.g., using mathematical models and coefficients specified by calibration data 19). The pixel correction values may, for example, be estimates of the stray light pixel value components generated by perturbed pixels 31 and unperturbed pixels 26. In general, the pixel correction values may be computed as any desired function of the captured pixel values and the identified pixel value statistics (e.g., based on mathematical models specified by calibration data 19).

At step 106, processing circuitry 22 may perform edge and/or texture detection operations on the pixel values captured by each pixel region of array 18. Processing circuitry 22 may determine whether there are any pixel value edges in the pixel values captured by each region and/or whether pixel values captured by each pixel region are within a texture area of the captured image (e.g., an area of the captured image having a relatively large number of edges of objects from the imaged scene). Processing circuitry 22 may perform texture detection operations using any desired texture detection algorithm (e.g., by applying spatial filters to the pixel values captured by pixel array 18). If desired, processing circuitry 22 may generate edge and/or texture maps for the pixel values in each pixel region. In some cases, pixel values that include edges and/or texture areas may cause processing circuitry 22 to generate inaccurate pixel values when correcting for local stray light in the captured pixel values.

At step 108, processing circuitry 22 may compare the pixel correction values generated for each pixel region in array 18. If desired, processing circuitry 22 may identify pixel regions for which the pixel correction values are likely to be unreliable (e.g., using the edge/texture maps generated associated with that pixel region). For example, processing circuitry 22 may determine that pixel regions having excessive textures and/or edges have unreliable pixel correction values (e.g., because pixel values that include edges and/or texture areas may cause processing circuitry 22 to generate inaccurate pixel values when correcting for local stray light in the captured pixel values). Processing circuitry 22 may label pixel correction values from pixel regions having excessive texture and/or edge areas as unreliable. If desired, processing circuitry 22 may label outlier pixel correction values that deviate excessively with respect to the other pixel correction values in array 18 (e.g., that deviate excessively with a mean pixel correction value for array 18) as unreliable pixel correction values.

Processing circuitry 22 may identify pixel regions in array 18 having local flare effects. For example, processing circuitry 22 may detect local flare artifacts in the pixel values from each pixel region. Processing circuitry 22 may determine whether local flare is present in a given pixel region based on the identified metadata (e.g., processing circuitry 22 may determine that local flare is present in a given pixel region if the metadata indicates that there is a bright object at or near the field of view of that pixel region).

At step 110, processing circuitry 22 may optionally perform local stray light compensation operations for each pixel region in array 18. For example, processing circuitry 22 may perform local stray light compensation operations on pixel regions that do not have any texture or edge areas or on pixel regions that do not have any outlier pixel correction values. As another example, processing circuitry 22 may perform local stray light compensation operations on pixel values that were identified as having local flare effects (e.g., during processing of step 108). If desired, processing circuitry 22 may omit local stray light compensation operations on pixel regions having excessive texture and/or edge areas (e.g., as illustrated by the generated edge/texture maps). Processing circuitry 22 may omit local stray light compensation operations on pixel regions that do not include any local flare effects.

If desired, processing circuitry 22 may perform local stray light compensation operations (e.g., local flare correction) on the pixel values generated by perturbed pixels 31 and/or unperturbed pixels 26 in a given pixel region (e.g., using the calculated pixel correction values). Processing circuitry may perform local flare correction using any desired local flare correction algorithm. For example, processing circuitry 22 may subtract the calculated pixel correction values from the pixel values generated by perturbed image pixels 31 and/or unperturbed image pixels 26. In this way, processing circuitry 22 may mitigate local flare effects and artifacts present in the pixel values generated by perturbed image pixels 31 and unperturbed image pixels 26.

At step 112, processing circuitry 112 may adjust pixel correction values that were determined to be unreliable (e.g., determined to be unreliable while processing step 108). For example, processing circuitry 22 may perform smoothing operations on the pixel correction values computed for pixel regions having unreliable pixel correction values. For example, processing circuitry 22 may replace the computed pixel correction values for a given pixel region (e.g., processing circuitry 22 may replace the pixel correction values for the given pixel region with reliable pixel correction values from adjacent pixel regions in array 18, may replace the pixel correction values for region 32 with interpolated pixel correction values, or may replace the pixel correction values for region 32 with any other desired pixel correction values). In this way, processing circuitry 22 may compensate for any outlier pixel correction values computed for each pixel region in array 18.

At step 114, processing circuitry 22 may generate perturbed pixel correction values for perturbed pixels 31 in each pixel region of clear filter pixel array 18. The generated perturbed pixel correction values may be based on the stray light that is blocked from perturbed pixels 31 by reference pixels 30. For example, processing circuitry 22 may compute the perturbed pixel correction values based on the captured pixel values and calibration data such as calibration data 19 as shown in FIG. 1 (e.g., using mathematical models of perturbed signal errors in calibration data 19). Processing circuitry 22 may adjust the pixel values generated by perturbed image pixels 31 in each image region of array 18 using the perturbed pixel correction values. In this way, processing circuitry 22 may compensate for the stray light 23 (FIG. 4) that is blocked by reference pixels 30 (e.g., to ensure that the stray light component of pixel values generated by perturbed pixel values 31 is consistent with that of unperturbed image pixels 26).

At step 116, processing circuitry 22 may perform array-wide correction operations on pixel values from each pixel region in array 18. For example, processing circuitry 22 may perform veiling glare compensation operations or any other desired global correction operations to the pixel values generated across pixel array 18. For pixel regions having excessive texture and/or edge areas, processing circuitry 22 may perform veiling glare compensation operations on those pixel regions in response to determining that those pixel regions have excessive texture and/or edge areas. If desired, processing circuitry 22 may uniformly adjust the pixel values captured by perturbed pixels 31 and/or unperturbed pixels 26 across array 18 by an offset value (e.g., a veiling glare correction value, estimated black level, or any other desired correction value associated with array-wide pixel value correction). In this way, processing circuitry 22 may compensate for stray light that is uniform across array 18 (e.g., veiling glare) in the pixel values generated by clear filter pixel array 18.

At step 118, processing circuitry 22 may perform defect correction operations on the reference pixel values gathered by reference pixels 30 in each pixel region of clear filter pixel array 18. Processing circuitry 22 may perform defect correction operations on the reference pixel values by replacing the reference pixel values with corrected reference pixel values. For example, processing circuitry 22 may replace reference pixel values generated by reference pixels 30 with interpolated pixel values that are computed by interpolating the pixel values generated by perturbed image pixels 31 and/or unperturbed image pixels 26. In another suitable arrangement, circuitry 22 may replace reference pixel values generated by reference pixels 30 with interpolated pixel values that are computed by interpolating stray light-corrected pixel values computed for perturbed image pixels 31 and/or unperturbed image pixels 26.

In this way, processing circuitry 22 may produce corrected pixel values for each pixel in pixel array 18 (e.g., for each reference pixel 30, perturbed pixel 31, and unperturbed pixel 26) that have been compensated for any stray light (e.g., to mitigate the effects of local flare, veiling glare, etc.). Processing circuitry 22 may subsequently use the corrected pixel values to perform accurate image processing operations (e.g., gamma correction operations, white balance operations, color correction operations, demosaicking operations, for read out as a final image signal, etc.).

Figure 9:
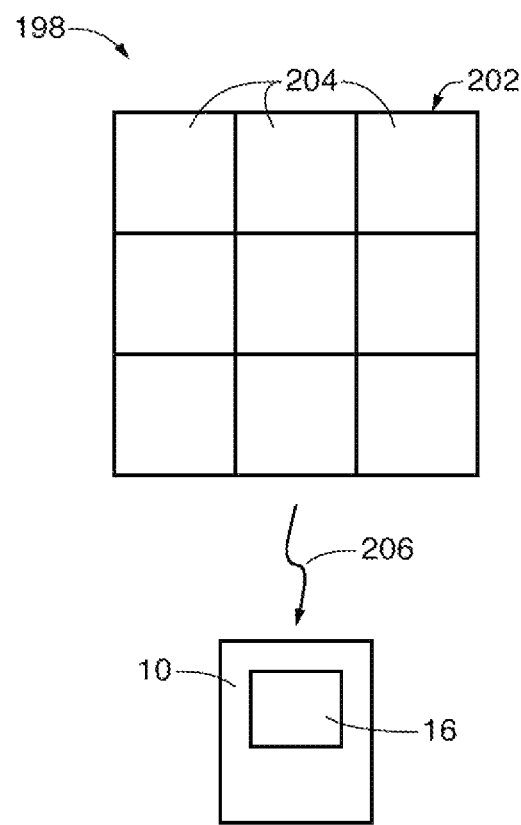
FIG. 9 is a diagram of an illustrative calibration system for generating calibration data to be used by an imaging system to compensate for stray light effects in the imaging system in accordance with an embodiment of the present invention.

Image sensor 16 may be tested and calibrated using a test system for generating calibration data 19. As shown in FIG. 9, device 10 may be calibrated using calibration system 198. Image sensor 16 may be calibrated prior to normal device operation (e.g., normal operation of device 10 by an end user). For example, image sensor 16 may be calibrated in calibration system 198 during manufacture of image sensor 16 and/or device 10, prior to assembly of device 10, etc. Calibration system 198 may include a greyscale target of patches 204. During calibration operations, image sensor 16 in device 10 may receive light 206 from a greyscale target 202 (e.g., light 206 may be reflected off of greyscale target 202). Greyscale target 202 may include any desired number of greyscale patches 204. Greyscale target 202 may, for example, be a poster or other visual target having multiple greyscale patches 204 that are each colored a different shade of grey, from white to black.

Greyscale target 202 may have multiple predetermined properties from which to calibrate the imaging performance of image sensor 16. For example, each patch 204 in greyscale target 202 may have a known reflectance value that is indicative of the percentage of incoming light that is reflected off of the associated patch 204. For example, darker patches 204 may have lower reflectance values than lighter patches 204. Storage and processing circuitry 22 on device 10 may store instructions for performing calibration operations for generating calibration data 19. For example, processing circuitry 22 may store calibration software or other calibration instructions for generating calibration data 19. The example of FIG. 9 is merely illustrative. If desired, device 10 may be coupled to an external calibration host (e.g., a personal computer, laptop computer, or other desired calibration equipment) for performing calibration operations. In this arrangement, the external host may provide calibration control signals to device 10 for performing calibration operations.

Figure 10:
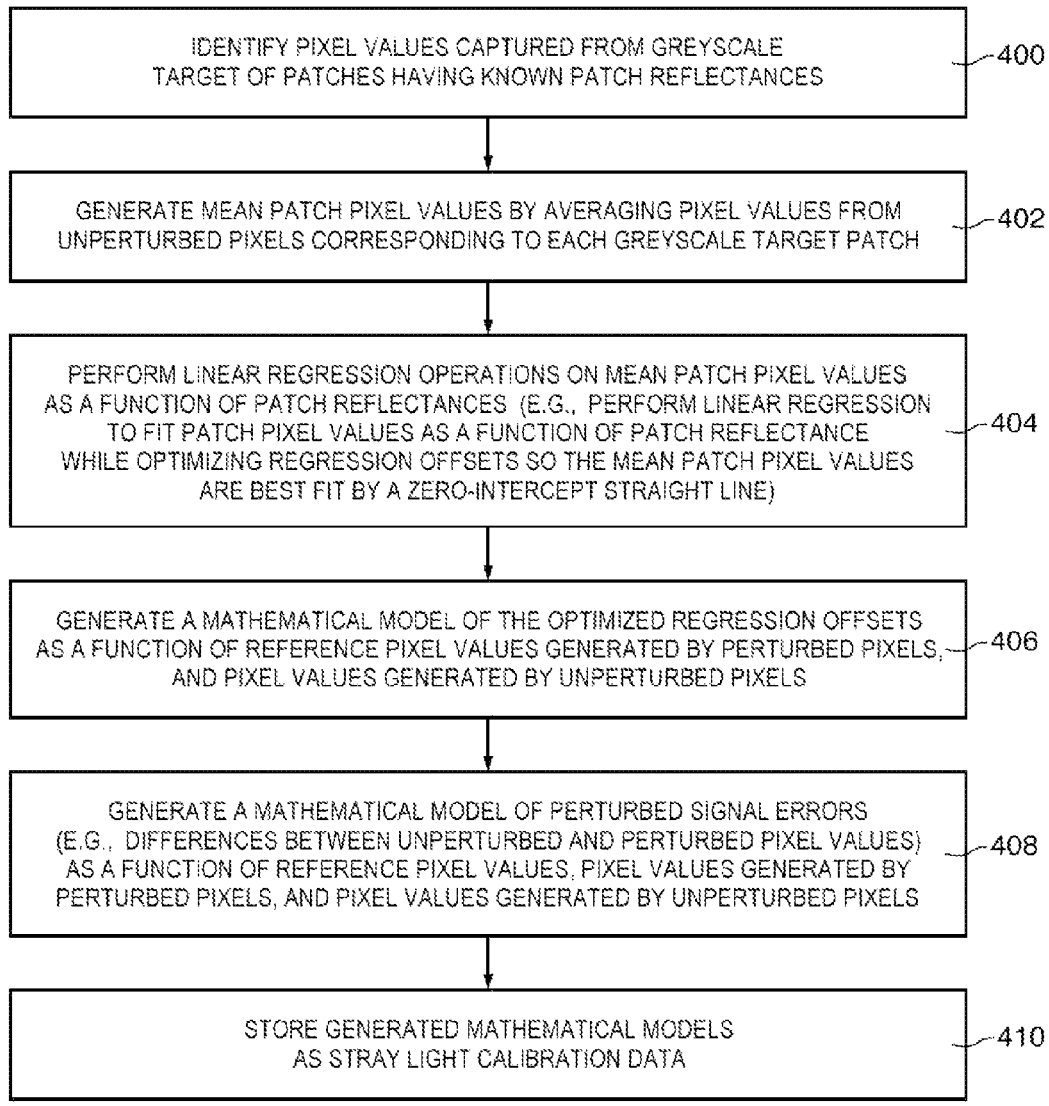
FIG. 10 is a flow chart of illustrative steps that may be performed by processing circuitry in an imaging system to generate calibration data for compensating for stray light in the imaging system in accordance with an embodiment of the present invention.

FIG. 10 shows a flow chart of illustrative steps that may be performed by storage and processing circuitry 22 on device 10 for generating stray light calibration data 19 (FIG. 1). The steps of FIG. 10 may, for example, be performed by processing circuitry 22 during assembly of device 10, during manufacture of image sensor 16, or at any other desired time prior to normal operation of device 10 (e.g., prior to use of device 10 by an end user). The steps of FIG. 10 may be performed by storage and processing circuitry 22 after pixel array 18 in image sensor 16 generates pixel values in response to light received from greyscale target 202 (e.g., in response to light reflected off of greyscale target 202).

At step 400, processing circuitry 22 may identify pixel values received from image sensor 16 corresponding to each patch 204 of greyscale target 202. For example, processing circuitry 22 may identify a first set of pixel values corresponding with a first greyscale patch 204, a second set of pixel values corresponding with a second greyscale patch 206, etc. Processing circuitry 22 may identify reference pixel values and pixel values captured by perturbed image pixels 31 and unperturbed pixels 26 (FIG. 6) for each greyscale patch 204.

At step 402, processing circuitry 22 may generate a respective mean patch pixel value for each greyscale patch 204 by averaging the pixel values captured by each unperturbed pixel 26 in the associated greyscale patch. In the example of FIG. 9 in which greyscale target 202 has nine patches 204, nine mean patch pixel values may be computed using unperturbed pixel values 26 in pixel array 18.

At step 404, processing circuitry 22 may perform linear regression on the mean patch pixel values as a function of patch reflectance value. The intercept obtained from this linear regression may be approximately equal to the desired veiling glare correction value. While performing linear regression on the mean patch pixel values, processing circuitry 22 may optimize offset values (e.g., intercept values) of the linear regression so that the mean patch pixel values are best fit by a zero-intercept straight line in patch reflectance space (e.g., processing circuitry 22 may perform linear regression operations on the mean pixel values as a function of the predetermined reflectance values by fitting the mean pixel values with a zero-intercept straight line).

At step 406, processing circuitry 22 may generate a mathematical model of the optimized regression offset values (e.g., the desired veiling glare correction values) as a function of reference pixel values, pixel values generated by perturbed pixels 31, and pixel values generated by unperturbed pixels 26. For example, the mathematical model may be a function or group of functions that depend on the gathered pixel values. The mathematical model may be subsequently used during normal operation of device 10 to generate pixel correction values for unperturbed pixels 26.

At step 408, processing circuitry 22 may generate a mathematical model of perturbed signal errors associated with the pixel values generated by perturbed pixels 31 as a function of reference pixel values and pixel values generated by unperturbed pixels 26. For example, processing circuitry 22 may model the difference between pixel values generated by perturbed pixels 31 and pixel values generated by unperturbed pixels 26. The mathematical model of perturbed signal errors may, for example, model the high incident angle light such as light 23 (FIG. 4) that is blocked from being captured by perturbed pixels 31 by reference pixels 30. The mathematical model of perturbed signal errors generated while processing step 408 may be used during normal device operation by processing circuitry 22 to generate perturbed pixel correction values for perturbed image pixels 31 (e.g., while performing step 114 of FIG. 8).

At step 410, processing circuitry 22 may store the generated mathematical models as calibration data 19 for use during normal operation of image sensor 16.

Figure 11:
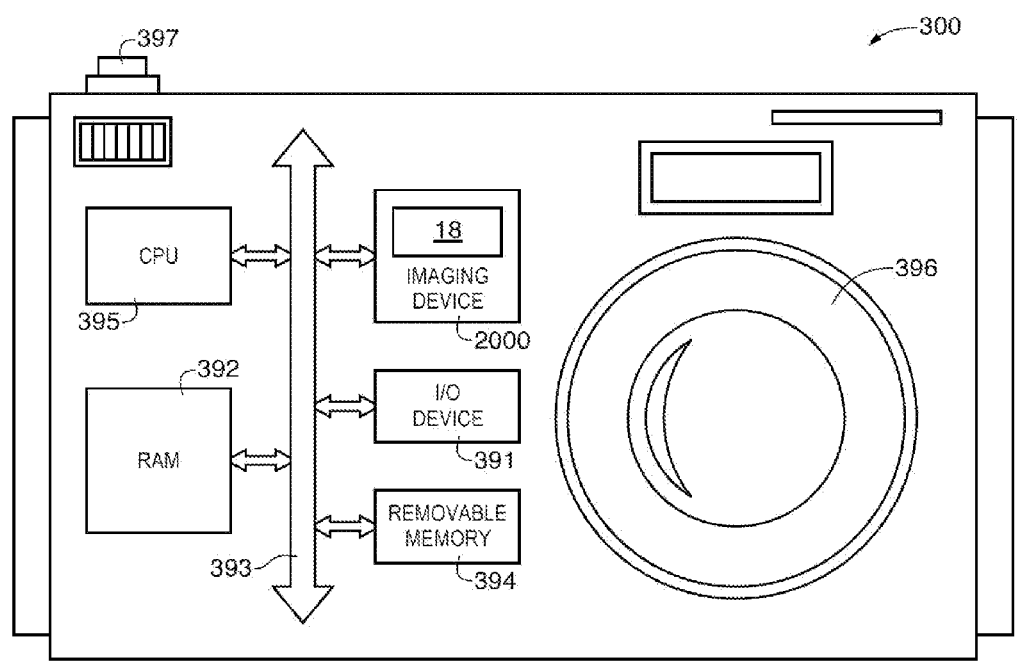
FIG. 11 is a block diagram of a processor system employing the embodiments of FIGS. 1-10 in accordance with an embodiment of the present invention.

FIG. 11 shows in simplified form a typical processor system 300, such as a digital camera, which includes an imaging device 2000 (e.g., an imaging device 2000 such as imaging sensor 16 and storage and processing circuitry 22 of FIGS. 1-10 employing clear color filters, reference pixels, and the techniques for operations described above). The processor system 300 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 300 generally includes a lens 396 for focusing an image on pixel array 18 of device 2000 when a shutter release button 397 is pressed, central processing unit (CPU) 395, such as a microprocessor which controls camera and one or more image flow functions, which communicates with one or more input/output (I/O) devices 391 over a bus 393. Imaging device 2000 also communicates with the CPU 395 over bus 393. The system 300 also includes random access memory (RAM) 392 and can include removable memory 394, such as flash memory, which also communicates with CPU 395 over the bus 393. Imaging device 2000 may be combined with the CPU, with or without memory storage on a single integrated circuit or on a different chip. Although bus 393 is illustrated as a single bus, it may be one or more busses or bridges or other communication paths used to interconnect the system components.

Various embodiments have been described illustrating imaging systems and methods of operating image systems having an array of image sensor pixels and reference pixels for mitigating the effects of image flare produced in the imaging system.

An imaging system may include an array of image sensor pixels having one or more reference pixels distributed throughout the image sensor pixels in the array. For example, the reference pixels may be formed in place of one or more image sensor pixels in the array.

The imaging system may include a lens for focusing an image onto the array of image sensor pixels and processing circuitry. The array of image sensor pixels may receive direct image light and stray light from the lens. The lens may pass direct image light onto the array within an image circle of the lens. If desired, the reference pixels may be located at a portion of the array that is outside of the image circle of the lens. The image sensor pixels may generate pixel values in response to the direct image light and the stray light and the reference pixels may generate reference pixel values in response to the stray light (E.g., stray light received through at least one of the image sensor pixels). The processing circuitry may adjust the pixel values based on the reference pixel values for mitigating the effects of image flare in the imaging system.

The reference pixels may include a photosensitive region and an opaque color filter element formed on an upper surface of the photosensitive region. The opaque color filter element may block direct image light from being received by the photosensitive region. The image sensor pixels and may include color filter elements. The color filter elements and opaque color filter elements may be arranged in a color filter array having repeating groups (e.g., repeating unit cells) of color filter elements.

The processing circuitry may perform stray light compensation operations on the pixel values based on the pixel values, the reference pixel values, statistics associated with the pixel values, calibration data stored on the processing circuitry, etc. For example, the processing circuitry may perform local flare compensation operations on the pixel values and/or veiling glare compensation operations on the pixel values to mitigate the effects of stray light in the imaging system. The processing circuitry may compute pixel correction values that have been compensated for local flare and/or veiling glare for the pixel values. If desired, the processing circuitry may compute perturbed pixel correction values for pixels adjacent to the reference pixels in the array that compensates for light that is blocked by the opaque color filter element.

If desired, the imaging system may be calibrated using a calibration system that includes a calibration target of greyscale patches. The greyscale patches may have predetermined reflectance values. The array may generate respective sets of pixel values and reference pixel values for each of the greyscale patches and the processing circuitry may generate respective sets of mean pixel values for each of the greyscale patches. The processing circuitry may perform linear regression operations by generating linear regression offset values for the mean pixel values as a function of the predetermined reflectance values and may generate the calibration data for the imaging device based on the linear regression offset values.

The imaging system with a clear filter pixel array and reference pixels and the associated techniques for compensating for stray light in the imaging system may be implemented in a system that also includes a central processing unit, memory, input-output circuitry, and an imaging device that further includes a pixel array, and a data converting circuit.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for operating an imaging system having processing circuitry and an array of image sensor pixels, wherein the array of image sensor pixels includes a reference pixel, the method comprising:
   with the array of image sensor pixels, receiving direct image light and stray light;
   with the image sensor pixels, generating pixel values in response to the direct image light and the stray light;
   with the reference pixel, generating a reference pixel value primarily in response to the stray light; and
   with the processing circuitry, adjusting the pixel values generated by the image sensor pixels based on the reference pixel value generated by the reference pixel, wherein adjusting the pixel values comprises:
   determining whether the pixel values comprise a texture area; and
   in response to determining that the pixel values comprise a texture, performing veiling glare compensation operations on the pixel values.

2. The method defined in claim 1, wherein the reference pixel comprises a photosensitive region, wherein the image sensor pixels include color filter elements, and wherein generating the reference pixel value primarily in response to the stray light comprises:

generating the reference pixel value in response to receiving the stray light at the photosensitive region of the reference pixel through at least one of the color filter elements.

3. The method defined in claim 2, wherein the reference pixel further comprises a black color filter element, the method further comprising:
    with the black color filter element, blocking the direct image light.

4. The method defined in claim 2, wherein the reference pixel further comprises a reference pixel color filter element having a metal layer, the method further comprising:
    with the metal layer, blocking the direct image light.

5. The method defined in claim 2, wherein the imaging system comprises a lens, the method further comprising:
    with the lens, passing the direct image light onto the array of image sensor pixels within an image circle of the lens, wherein the reference pixel is located on a portion of the array outside of the image circle of the lens.

6. The method defined in claim 2, wherein the processing circuitry is configured to store stray light calibration data and wherein adjusting the pixel values comprises:
    performing local flare compensation operations on the pixel values based on the reference pixel value and the stray light calibration data.

7. The method defined in claim 6, wherein adjusting the pixel values further comprises:
    performing veiling glare compensation operations on the pixel values.

8. The method defined in claim 6, wherein performing the local flare compensation operations comprises:
    identifying pixel value statistics associated with the pixel values; and
    computing pixel correction values based on the reference pixel value, the identified pixel value statistics, and the stray light calibration data.

9. The method defined in claim 8, wherein performing the local flare compensation operations further comprises:
    identifying pixel value metadata associated with the pixel values; and
    computing the pixel correction values based on the pixel value metadata.

10. The method defined in claim 9, wherein the pixel value metadata comprises signal-to-noise ratio information and wherein performing the local flare compensation operations further comprises:
    computing the pixel correction values based on the signal-to-noise ratio information.

11. The method defined in claim 9, wherein the pixel value metadata comprises light level information and wherein performing the local flare compensation operations further comprises:
    computing the pixel correction values based on the light level information.

12. The method defined in claim 8, wherein the reference pixel comprises an opaque color filter element and wherein computing the pixel correction values comprises:
    computing a perturbed pixel correction value for an image sensor pixel located adjacent to the reference pixel that compensates for light that is blocked by the opaque color filter element.

13. The method defined in claim 2, wherein the color filter elements of the image sensor pixels comprise clear color filter elements.

14. A method for operating an imaging system having processing circuitry and an array of image sensor pixels, wherein the array of image sensor pixels includes a reference pixel, the method comprising:
    with the array of image sensor pixels, receiving direct image light and stray light;
    with the image sensor pixels, generating pixel values in response to the direct image light and the stray light;
    with the reference pixel, generating a reference pixel value primarily in response to the stray light; and
    with the processing circuitry, adjusting the pixel values generated by the image sensor pixels based on the reference pixel value generated by the reference pixel, wherein adjusting the pixel values comprises:
        determining whether the pixel values comprise an edge area; and
        in response to determining that the pixel values comprise an edge area, performing veiling glare compensation operations on the pixel values.

15. The method defined in claim 14, further comprising:
    with the processing circuitry, replacing the reference pixel value with an interpolated pixel value.

16. The method defined in claim 14, wherein the reference pixel comprises a photosensitive region, wherein the image sensor pixels include color filter elements, and wherein generating the reference pixel value primarily in response to the stray light comprises:
    generating the reference pixel value in response to receiving the stray light at the photosensitive region of the reference pixel through at least one of the color filter elements.

17. A system, comprising:
    a central processing unit;
    memory;
    input-output circuitry; and
    an imaging device, wherein the imaging device comprises:
        an array of image sensor pixels arranged in rows and columns, wherein the array includes a reference pixel;
        a lens that focuses an image onto the array within an image circle of the lens, wherein image sensor pixels in the array that are within the image circle of the lens are configured to receive direct image light and stray light from the lens, wherein the image sensor pixels within the image circle of the lens are configured to generate pixel values in response to the direct image light and the stray light, wherein the reference pixel is located in the array and outside of the image circle of the lens and is configured to generate a reference pixel value in response to the stray light, and wherein the reference pixel is formed without any opaque light shielding elements that shield the reference pixel from the direct light; and
        processing circuitry configured to adjust the pixel values based on the reference pixel value.

18. The system defined in claim 17, wherein the image sensor pixels comprise clear color filter elements.

19. The system defined in claim 18, wherein the clear color filter elements are arranged in a color filter array, wherein the color filter array comprises repeating groups of red color filter elements, blue color filter elements, and the clear color filter elements.

* * * * *